United States Patent
Kizilyalli et al.

(10) Patent No.: US 9,029,687 B2
(45) Date of Patent: *May 12, 2015

(54) PHOTOVOLTAIC DEVICE WITH BACK SIDE CONTACTS

(75) Inventors: Isik C. Kizilyalli, San Francisco, CA (US); Melissa Archer, Mountain View, CA (US); Harry Atwater, South Pasadena, CA (US); Thomas J. Gmitter, Sunnyvale, CA (US); Gang He, Cupertino, CA (US); Andreas Hegedus, Burlingame, CA (US); Gregg Higashi, San Jose, CA (US)

(73) Assignee: Alta Devices, Inc., Sunnyvale, CA (US)

( * ) Notice: Subject to any disclaimer, the term of this patent is extended or adjusted under 35 U.S.C. 154(b) by 285 days.

This patent is subject to a terminal disclaimer.

(21) Appl. No.: 12/605,151

(22) Filed: Oct. 23, 2009

(65) Prior Publication Data

US 2010/0126572 A1    May 27, 2010

Related U.S. Application Data

(60) Provisional application No. 61/107,966, filed on Oct. 23, 2008.

(51) Int. Cl.
*H01L 31/00* (2006.01)
*H01L 31/0224* (2006.01)
(Continued)

(52) U.S. Cl.
CPC . *H01L 31/022441* (2013.01); *H01L 31/022425* (2013.01); *H01L 31/0304* (2013.01);
(Continued)

(58) Field of Classification Search
CPC ............. H01L 31/022441; H01L 31/035281; H01L 31/0304; H01L 31/03046; H01L 31/0735

USPC .......................................................... 136/255
See application file for complete search history.

(56) References Cited

U.S. PATENT DOCUMENTS 4,002,031 A * 1/1977 Bell ........................... 60/641.15
4,915,744 A * 4/1990 Ho et al. ...................... 136/262
(Continued)

FOREIGN PATENT DOCUMENTS

| EP | 595634 A1 | 5/1994 |
| JP | 63-211775 | * 9/1988 |
| WO | WO-02065553 A1 | 8/2002 |

OTHER PUBLICATIONS

English lanuage abstract from JPO of JP63-211775, pub. Sep. 1988.*
(Continued)

*Primary Examiner* — Allison Bourke
(74) *Attorney, Agent, or Firm* — Sawyer Law Group, P.C.

(57) ABSTRACT

Methods and apparatus for converting electromagnetic radiation, such as solar energy, into electric energy with increased efficiency when compared to conventional solar cells are provided. A photovoltaic (PV) device generally includes a window layer; an absorber layer disposed below the window layer such that electrons are generated when photons travel through the window layer and are absorbed by the absorber layer; and a plurality of contacts for external connection coupled to the absorber layer, such that all of the contacts for external connection are disposed below the absorber layer and do not block any of the photons from reaching the absorber layer through the window layer. Locating all the contacts on the back side of the PV device avoids solar shadows caused by front side contacts, typically found in conventional solar cells. Therefore, PV devices described herein with back side contacts may allow for increased efficiency when compared to conventional solar cells.

14 Claims, 4 Drawing Sheets

(51) Int. Cl.
H01L 31/0304 (2006.01)
H01L 31/0352 (2006.01)
H01L 31/0735 (2012.01)
H01L 31/18 (2006.01)

(52) U.S. Cl.
CPC .. *H01L31/03046* (2013.01); *H01L 31/035281* (2013.01); *H01L 31/0735* (2013.01); *H01L 31/184* (2013.01); *H01L 31/1844* (2013.01); *H01L 31/1852* (2013.01); *H01L 31/1892* (2013.01); *Y02E 10/544* (2013.01)

(56) References Cited

U.S. PATENT DOCUMENTS

| | | | | |
|---|---|---|---|---|
| 6,084,175 | A * | 7/2000 | Perry et al. | 136/256 |
| 6,252,287 | B1 * | 6/2001 | Kurtz et al. | 257/461 |
| 2001/0027805 | A1 | 10/2001 | Ho et al. | |
| 2004/0035458 | A1 | 2/2004 | Beernink et al. | |
| 2005/0272225 | A1 | 12/2005 | Weber et al. | |
| 2007/0151599 | A1 * | 7/2007 | Cousins | 136/263 |
| 2007/0256728 | A1 * | 11/2007 | Cousins | 136/252 |
| 2007/0277874 | A1 | 12/2007 | Dawson-Elli et al. | |
| 2008/0072953 | A1 * | 3/2008 | Stephens et al. | 136/249 |
| 2010/0018565 | A1 | 1/2010 | Funakoshi | |
| 2010/0032014 | A1 * | 2/2010 | Bettinelli et al. | 136/258 |
| 2010/0126552 | A1 | 5/2010 | Kizilyalli et al. | |
| 2010/0126570 | A1 | 5/2010 | Kizilyalli et al. | |
| 2010/0126571 | A1 | 5/2010 | Kizilyalli et al. | |
| 2010/0132780 | A1 | 6/2010 | Kizilyalli et al. | |
| 2010/0236613 | A1 * | 9/2010 | Lee et al. | 136/255 |
| 2012/0104460 | A1 * | 5/2012 | Nie et al. | 257/184 |

OTHER PUBLICATIONS

Definition of adjacent from Merriam-Websters Dictionary, <http://www.merriam-webster.com/dictionary/adjacent>, accessed Nov. 30, 2010.*
translaton of JP63-211775, pub. Sep. 1988.*
International Search Report and Written Opinion for International Application No. PCT/US2009/061914.
International Search Report and Written Opinion dated Jun. 1, 2010 for International Application No. PCT/US2009/061898.
International Search Report and Written Opinion dated Jun. 1, 2010 for International Application No. PCT/US2009/061906.
International Search Report and Written Opinion dated Jun. 1, 2010 for International Application No. PCT/US2009/061911.
International Search Report and Written Opinion dated Jun. 1, 2010 for International Application No. PCT/US2009/061920.

* cited by examiner

PHOTOVOLTAIC DEVICE WITH BACK SIDE CONTACTS

CROSS-REFERENCE TO RELATED APPLICATIONS

This application claims benefit of U.S. Provisional Patent Application Ser. No. 61/107,966 filed Oct. 23, 2008, which is herein incorporated by reference in its entirety.

BACKGROUND

1. Technical Field

Embodiments of the present invention generally relate to photovoltaic (PV) devices, such as solar cells, with increased efficiency and greater flexibility and methods for fabricating the same.

2. Description of the Related Art

As fossil fuels are being depleted at ever-increasing rates, the need for alternative energy sources is becoming more and more apparent. Energy derived from wind, from the sun, and from flowing water offer renewable, environment-friendly alternatives to fossil fuels, such as coal, oil, and natural gas. Being readily available almost anywhere on Earth, solar energy may someday be a viable alternative.

To harness energy from the sun, the junction of a solar cell absorbs photons to produce electron-hole pairs, which are separated by the internal electric field of the junction to generate a voltage, thereby converting light energy to electric energy. The generated voltage can be increased by connecting solar cells in series, and the current may be increased by connecting solar cells in parallel. Solar cells may be grouped together on solar panels. An inverter may be coupled to several solar panels to convert DC power to AC power.

Nevertheless, the currently high cost of producing solar cells relative to the low efficiency levels of contemporary devices is preventing solar cells from becoming a mainstream energy source and limiting the applications to which solar cells may be suited. Accordingly, there is a need for more efficient photovoltaic devices suitable for a myriad of applications.

SUMMARY OF THE INVENTION

Embodiments of the present invention generally relate to methods and apparatus for converting electromagnetic radiation, such as solar energy, into electric energy with increased efficiency when compared to conventional solar cells.

One embodiment of the present invention provides a photovoltaic (PV) device. The PV device generally includes a window layer, an absorber layer disposed below the window layer such that electrons are generated when photons travel through the window layer and are absorbed by the absorber layer, and a plurality of contacts for external connection coupled to the absorber layer, such that the contacts for external connection are disposed below the absorber layer and do not block the photons from reaching the absorber layer through the window layer.

Another embodiment of the present invention is a method of fabricating a PV device. The method generally includes forming a window layer above a substrate, forming an absorber layer above the window layer such that electrons are generated when photons travel through the window layer and are absorbed by the absorber layer, and forming a plurality of contacts for external connection coupled to the absorber layer, such that the contacts for external connection are disposed above the absorber layer and do not block the photons from reaching the absorber layer through the window layer.

BRIEF DESCRIPTION OF THE DRAWINGS

So that the manner in which the above-recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide techniques and apparatus for converting electromagnetic radiation, such as solar energy, into electric energy with increased efficiency when compared to conventional solar cells.

An Exemplary Photovoltaic Unit

Figure 1:
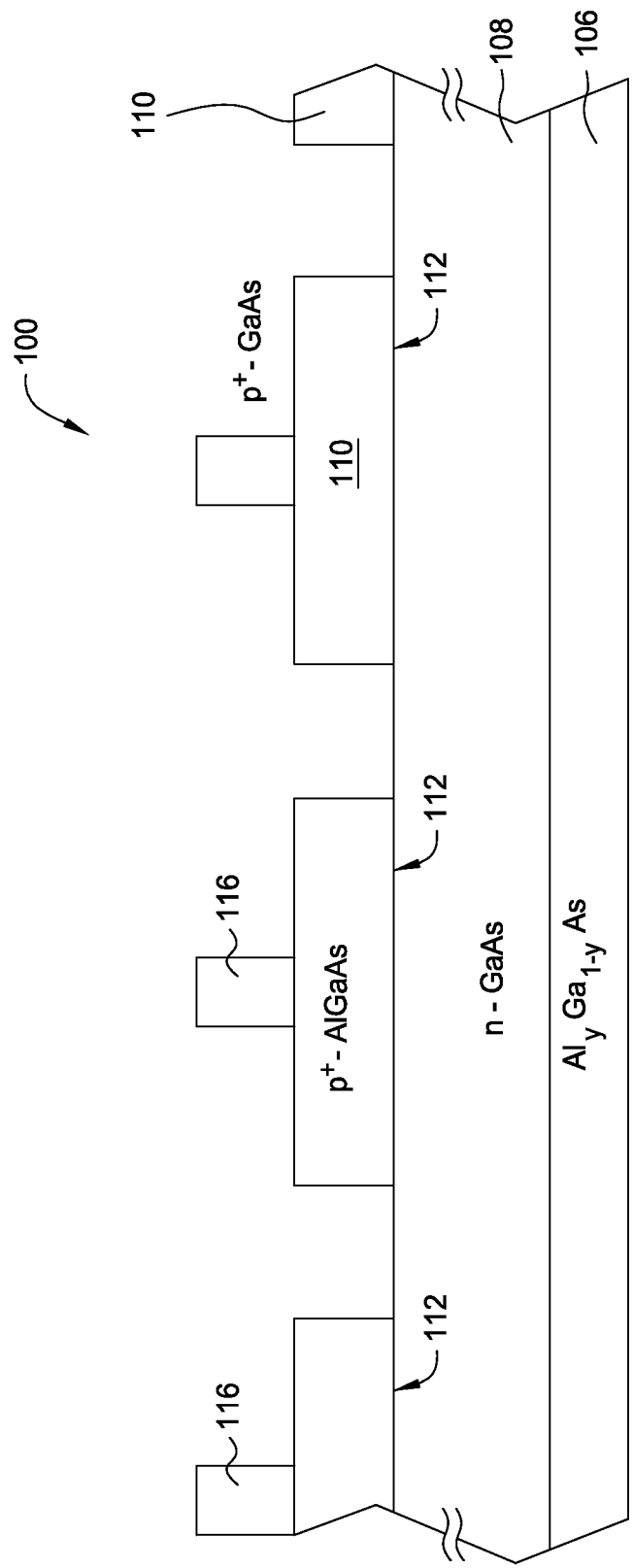
FIG. 1 illustrates multiple epitaxial layers for a photovoltaic (PV) unit in cross-section, in accordance with an embodiment of the present invention.

FIG. 1 illustrates various epitaxial layers of a photovoltaic (PV) unit 100 in cross-section. The various layers may be formed using any suitable method for semiconductor growth, such as molecular beam epitaxy (MBE) or metalorganic chemical vapor deposition (MOCVD), on a substrate (not shown).

The PV unit 100 may comprise a window layer 106 formed above the substrate and any underlying buffer layer(s). The window layer 106 may comprise aluminum gallium arsenide (AlGaAs), such as $Al_{0.3}Ga_{0.7}As$. The window layer 106 may be undoped. The window layer 106 may be transparent to allow photons to pass through the window layer on the front side of the PV unit to other underlying layers.

A base layer 108 may be formed above the window layer 106. The base layer 108 may comprise any suitable group III-V compound semiconductor, such as GaAs. The base layer 108 may be monocrystalline and may be n-doped.

As illustrated in FIG. 1, an emitter layer 110 may be formed above the base layer 108. The emitter layer 110 may comprise any suitable group III-V compound semiconductor for forming a heterojunction with the base layer 108. For example, if the base layer 108 comprises GaAs, the emitter layer 110 may comprise a different semiconductor material, such as AlGaAs (e.g., $Al_{0.3}Ga_{0.7}As$). If the emitter layer 110 and the window layer 106 both comprise AlGaAs, the $Al_xGa_{1-x}As$ composition of the emitter layer 110 may be the same as or different than the $Al_yGa_{1-y}As$ composition of the window layer 106. The emitter layer 110 may be monocrystalline and may be heavily p-doped p$^+$-doped). The combination of the base layer 108 and the emitter layer 110 may form an absorber layer for absorbing photons.

The contact of an n-doped base layer to a p$^+$-doped emitter layer creates a p-n layer 112. When light is absorbed near the p-n layer 112 to produce electron-hole pairs, the built-in electric field may force the holes to the p$^+$-doped side and the electrons to the n-doped side. This displacement of free charges results in a voltage difference between the two layers 108, 110 such that electron current may flow when a load is connected across terminals coupled to these layers.

Rather than an n-doped base layer 108 and a p$^+$-doped emitter layer 110 as described above, conventional photovoltaic semiconductor devices typically have a p-doped base layer and an n$^+$-doped emitter layer. The base layer is typically p-doped in conventional devices due to the diffusion length of the carriers.

Once the emitter layer 110 has been formed, cavities or recesses 114 may be formed in the emitter layer deep enough to reach the underlying base layer 108. Such recesses 114 may be formed by applying a mask to the emitter layer 110 using photolithography, for example, and removing the semiconductor material in the emitter layer 110 not covered by the mask using any suitable technique, such as wet or dry etching. In this manner, the base layer 108 may be accessed via the back side of the PV unit 100.

For some embodiments, an interface layer 116 may be formed above the emitter layer 110. The interface layer 116 may comprise any suitable group III-V compound semiconductor, such as GaAs. The interface layer 116 may be p$^+$-doped.

Once the epitaxial layers have been formed, the functional layers of the PV unit 100 (e.g., the window layer 106, the base layer 108, and the emitter layer 110) may be separated from the buffer layer(s) 102 and substrate during an epitaxial lift-off (ELO) process.

Exemplary Electrical Contacts

Electrical contacts may be used to couple the semiconductor layers of the PV unit 100 to wires for connection to other PV units and for external connection to a load. A conventional solar cell typically has contacts on both the front and back sides of the cell. Front side contacts, especially thicker ones, create shadows where light cannot reach the underlying absorber layer to be converted into electric energy. Therefore, the efficiency potential of the solar cell cannot be obtained. Accordingly, techniques and apparatus for contacting the semiconductor layers of the PV unit without introducing shadows are needed.

Figure 2:
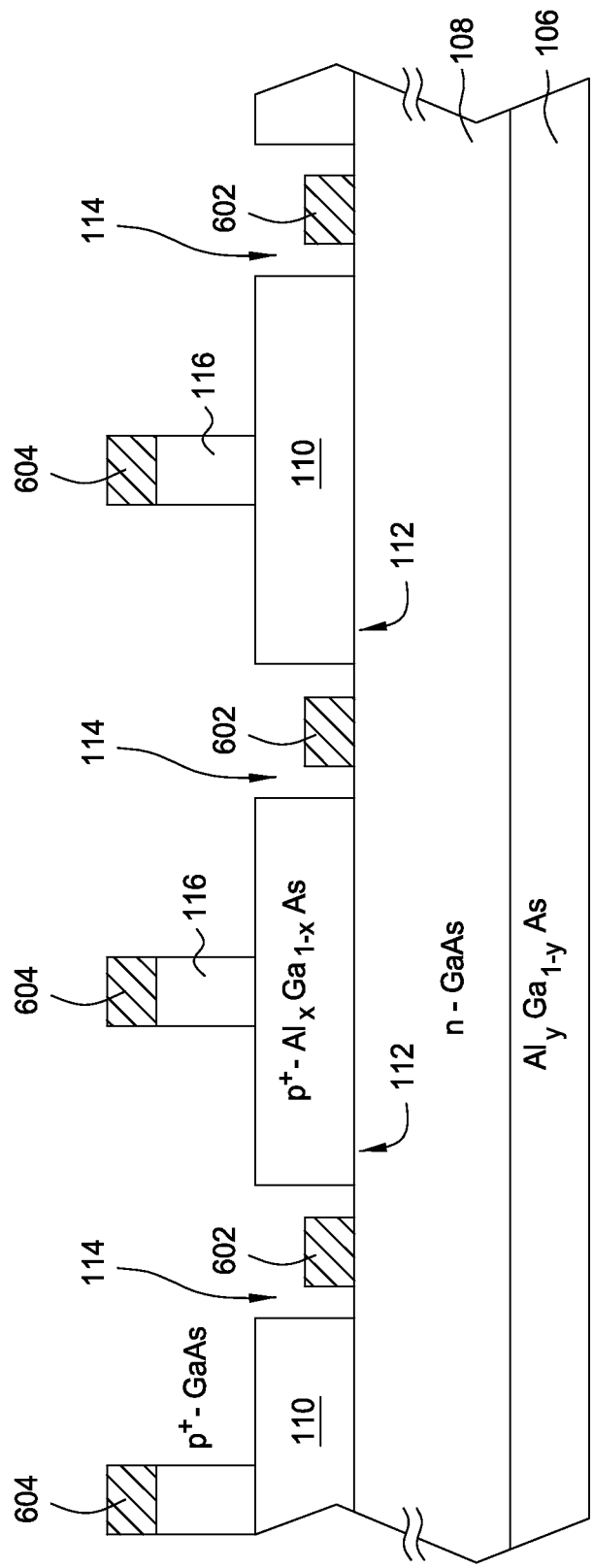
FIG. 2 illustrates contacts to the semiconductor layers being on the back side of the PV unit, in accordance with an embodiment of the present invention.

FIG. 2 illustrates all electrical contacts to the semiconductor layers being on the back side of the PV unit 100, according to an embodiment of the present invention. For example, n-contacts 602 may be formed in the recesses 114 to provide an interface to the n-doped base layer 108, and p-contacts 604 may be formed above the interface layer 116 to couple to the p$^+$-doped emitter layer 110. The heavy doping in the p$^+$-doped interface layer 116 may facilitate making an ohmic contact. In this manner, efficiency need not be sacrificed by having electrical contacts on the front side of the PV unit to block light and create solar shadows.

The pattern of the recesses 114 in the emitter layer 110 and the remaining portion of the interface layer 116 for the contacts 602, 604 may be based on the desired sheet resistance. The dimensions (e.g., area) of the contacts 602, 604 may be very small compared to the dimensions (e.g., area) of a single PV unit 100. What is more, the pattern of the contacts 602, 604 may provide a built-in tolerance against local defects and shadowing.

The contacts 602, 604 may comprise any suitable electrically conductive material, such as a metal or a metal alloy. Preferably, the material for the contacts should not punch through the semiconductor layers during fabrication. Traditional contacts comprising gold (Au) often had this spiking problem. Furthermore, the material for the back side contacts may preferably be capable of being applied at relatively low metallization process temperatures, such as between 150 and 200° C. For example, the contact 602, 604 may comprise palladium/germanium (Pd/Ge) to meet these design goals. Palladium does not react with GaAs.

Whatever material is selected, the contacts 602, 604 may be fabricated on the PV unit 100 by any suitable method, such as vacuum-evaporation through a photoresist, photolithography, screen printing, or merely depositing on the exposed portion of the PV units that have been partially covered with wax or another protective material. These methods all involve a system in which the part of the PV unit on which a contact is not desired is protected, while the rest of the PV unit is exposed to the metal. Of these, screen printing may be the most cost effective, helping to decrease the cost of the resulting PV devices.

Despite all the contacts 602, 604 being on the back side of the PV unit 100 to reduce solar shadows, dark current and its stability with time and temperature may still be concerns when designing an efficient PV unit. An exposed p-n layer 112 may be a source of dark current, and larger recesses 114 may be responsible for an increase in dark current. Thus, smaller recesses 114 may be desired. However, there is a tradeoff between reducing the size of the recesses 14 to reduce dark current and the probability of fabricating the n-contacts 602 in the recesses 114 without touching the sidewalls.

Figure 3:
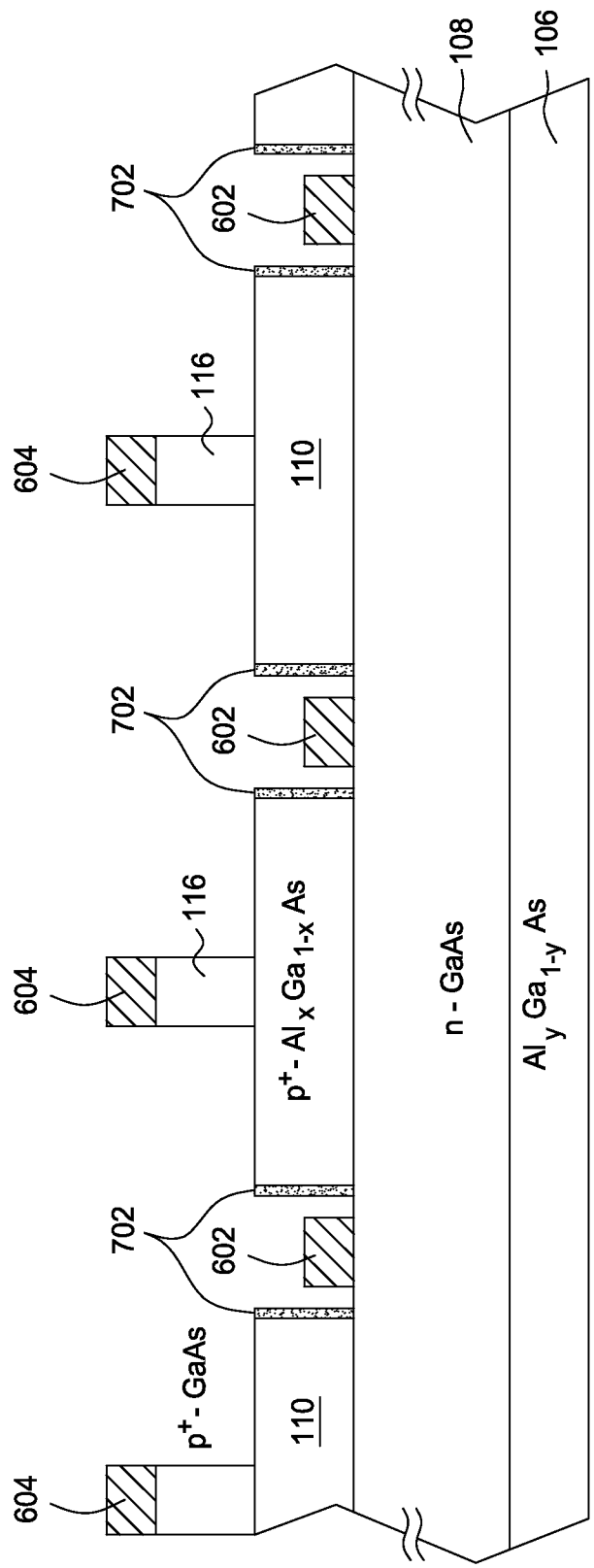
FIG. 3 illustrates passivation on the edges of the recesses in the emitter layer, in accordance with an embodiment of the present invention.

Therefore, for some embodiments, the sidewalls of the recesses 114 may be passivated as another way to reduce the dark current in the PV unit. FIG. 3 illustrates passivation 702 on the sidewalls (i.e., lateral surfaces) of the recesses 114 in the emitter layer 110, in accordance with an embodiment of the present invention. The sidewalls may be passivated most likely before—but possibly after—the n-contacts 602 are formed, using any suitable passivation method, such as chemical vapor deposition (CVD) or plasma-enhanced CVD (PECVD). The passivation 702 may comprise any suitable electrically non-conductive material, such as silicon nitride (SiN), $SiO_x$, $TiO_x$, $TaO_x$, zinc sulfide (ZnS), or any combination thereof.

Figure 4A:
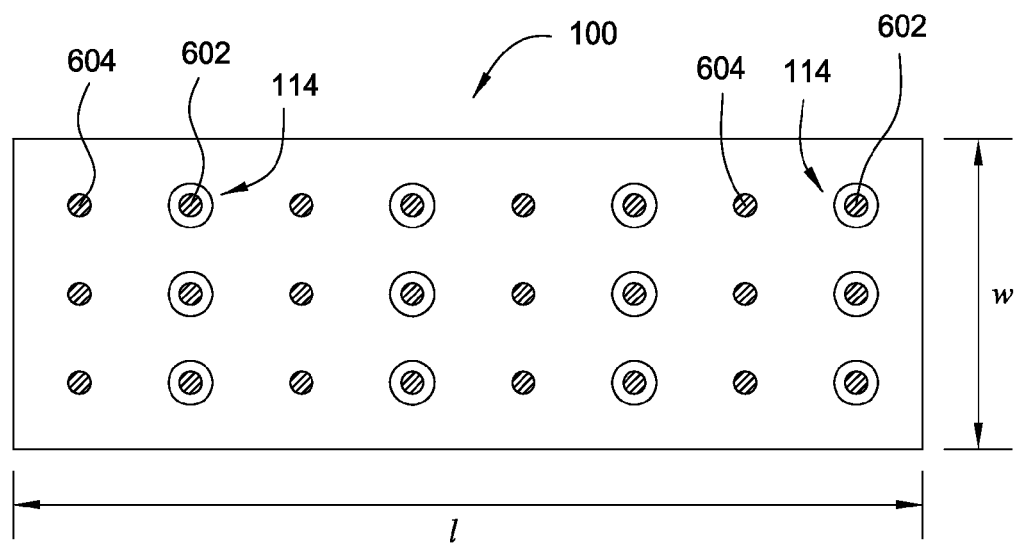
FIG. 4A illustrates the back side of the PV unit, in accordance with an embodiment of the present invention.

FIG. 4A illustrates the back side of the PV unit 100, wherein all the contacts 602, 604 are disposed on the back side. As described above, the n-contacts 602 may be located within the recesses 114 in the emitter layer 110. The PV unit 100 may have a width w of about 2 to 3 cm and a length l of about 10 cm.

Figure 4B:
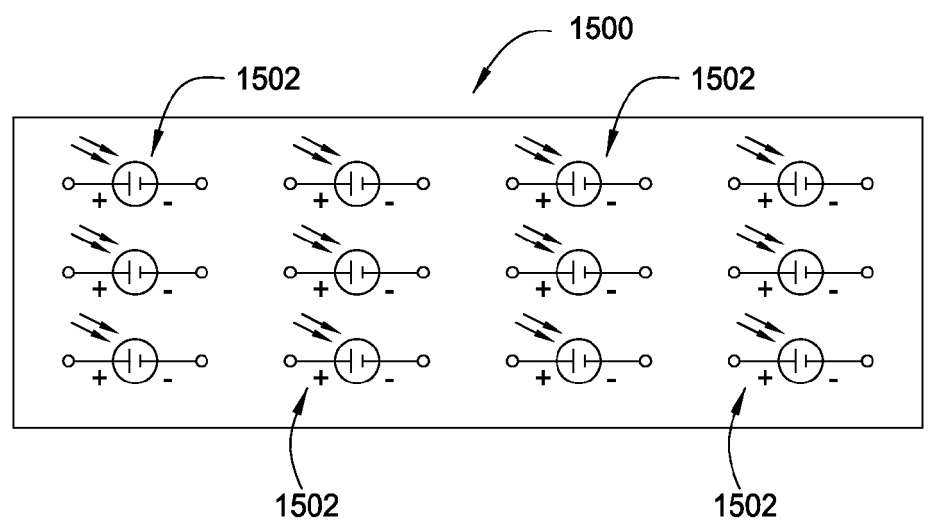
FIG. 4B illustrates an equivalent electrical circuit of the PV unit of FIG. 4A, in accordance with an embodiment of the present invention.

FIG. 4B illustrates an equivalent electrical circuit 1500 of the PV unit 100 of FIG. 4A. One may consider the PV unit 100 as having an efficient miniature solar cell 1502 between each n-contact 602 and p-contact 604. Within a PV unit 100, all of the n-contacts 602 are coupled to the same base layer 108 and all of the p-contacts 604 are coupled to the same emitter layer 110. Therefore, the open circuit voltage ($V_{oc}$) of the equivalent circuit 1500 may be modeled as the sum of the open circuit voltages across the miniature solar cells 1502 in series, and the short circuit current ($I_{sc}$) may be modeled as the sum of the short circuit currents across the miniature solar cells 1502 in parallel. In essence, the equivalent electrical circuit

1500 of the PV unit 100 may be thought of as a single solar cell with a greater $V_{oc}$ and a larger $I_{sc}$ than those of the miniature solar cells 1502 which compose it.

While the foregoing is directed to embodiments of the invention, other and further embodiments of the invention may be devised without departing from the basic scope thereof, and the scope thereof is determined by the claims that follow.

The invention claimed is:

1. A photovoltaic (PV) device, comprising:
   a window layer exposed to a light source;
   an absorber layer disposed above the window layer such that electrons are generated when photons travel through the window layer and are absorbed by the absorber layer; wherein the absorber layer comprises a base layer and an emitter layer; wherein the base layer consists of a single group III-V compound semiconductor material and wherein the emitter layer is made of a different material than the base layer, such that a heterojunction is formed between the emitter layer and the base layer, and
   a plurality of contacts for external connection coupled to the absorber layer, such that the contacts for external connection are disposed above the absorber layer on the back side of the PV device and do not block the photons from reaching the absorber layer through the window layer and n-contacts of the plurality of contacts are disposed within recesses formed within the emitter layer, wherein sidewalls of the recesses are passivated in order to reduce dark current in the PV unit.

2. The PV device of claim 1, wherein the emitter layer comprises a group III-V semiconductor.

3. The PV device of claim 2, wherein the group III-V semiconductor is monocrystalline.

4. The PV device of claim 1, wherein the base layer is disposed above the window layer; and
   the emitter layer is disposed above the base layer such that the window layer is closer to the base layer than it is to the emitter layer.

5. The PV device of claim 1, wherein the base layer is n-doped.

6. The PV device of claim 5, wherein the base layer consists of n-GaAs.

7. The PV device of claim 1, wherein the emitter layer is $p^+$-doped.

8. The PV device of claim 7, wherein the emitter layer comprises $p^+$-AlGaAs.

9. The PV device of claim 4, wherein the plurality of contacts comprise:
   a plurality of n-contacts coupled to the base layer; and
   a plurality of p-contacts coupled to the emitter layer.

10. The PV device of claim 1, wherein the lateral surfaces are passivated with SiN, SiOx, TiOx, TaOx, ZnS, or any combination thereof.

11. The PV device of claim 1, wherein the plurality of contacts comprise Pd/Ge.

12. The PV device of claim 1, wherein the PV device has a width of about 2 cm.

13. The PV device of claim 1, wherein the PV device has a length of about 10 cm.

14. The PV device of claim 1, wherein the photons travel through the window layer on a front side of the PV device and all of the plurality of contacts are disposed on a back side of the PV device, opposite from the front side.

* * * * *